Jan. 12, 1971 W. McIVER ET AL 3,555,488

PRINTED CIRCUIT BOARD CONNECTOR

Filed May 8, 1969 2 Sheets-Sheet 1

INVENTORS.
WILLIAM McIVER
CHARLES F. BRICKELL
BY
Harvey S. Hertz
ATTORNEY

PRINTED CIRCUIT BOARD CONNECTOR

Filed May 8, 1969 2 Sheets-Sheet 2

INVENTORS.
WILLIAM McIVER
CHARLES F. BRICKELL
BY
Harvey L. Hertz
ATTORNEY

United States Patent Office 3,555,488

Patented Jan. 12, 1971

3,555,488

PRINTED CIRCUIT BOARD CONNECTOR

William McIver, West Monroe, La., and Charles F. Brickell, Fullerton, Calif., assignors to International Telephone and Telegraph Corporation, New York, N.Y., a corporation of Delaware Filed May 8, 1969, Ser. No. 823,006
Int. Cl. H01r *13/54*
U.S. Cl. 339—75 5 Claims

ABSTRACT OF THE DISCLOSURE

The disclosure relates to a cam actuated printed circuit board connector. The connector contains an opening therethrough for insertion of a printed circuit board. A cam is provided for driving a plate member in a horizontal direction. Movement of the plate member causes a vertical actuating member to move in a vertical direction perpendicular to the diretcion of the plate member. Vertical movement of the actuating member causes the connector contacts to move into initimate contact with the printed circuit board pads.

PRINTED CIRCUIT BOARD CONNECTOR

The invention relates in general to printed circuit board connectors, and, more particularly, to a printed circuit board connector which is actuated by movement of an actuating member in a vertical plane.

BACKGROUND OF THE INVENTION

In U.S. patent application No. 792,585, filed Jan. 21, 1969, entitled, "Cam Actuated Printed Circuit Board Connector," and assigned to the assignee of the present application, there is described a printed circuit board connector wherein basically no force is applied between the printed circuit board pads and the connector contacts during insertion and extraction of the printed circuit board. A cam is provided for driving a housing actuating member in a horizontal direction along its longitudinal axis forcing actuating spacers up ramp angles in a direction perpendicular to said longitudinal axis. Movement of the spacers drive the connector contacts into intimate contact with the printed circuit board. Further, when it is desired to remove the printed circuit board the cam is rotated so that the actuating spacers move back down the ramp angle and the connector contacts are no longer in intimate contact with the printed circuit board pads. The aforementioned printed circuit board connector allows the connector actuating means to be miniaturized and have other advantages such as reduction in the resistance of the contact member while simultaneously maintaining high contact pressures. However, a prime disadvantage of the aforementioned printed circuit board connector is that the housing itself must be moved, causing stress forces to be applied to the housing. Thus, the housing must be made of sufficient strength and of the proper material to withstand such forces.

In order to overcome the attendant disadvantages of prior art printed circuit board connectors, the present invention allows the printed circuit board to be inserted and extracted with basically no force applied to the printed circuit board. Moreover, wear on the printed circuit board is overcome due to the elimination of the force the spring contacts exert against the forward end of the printed circuit pads when the board is inserted and extracted. Further, the connector housing may be made of an inexpensive material due to the minimum stress applied to the housing by the actuating means.

The advantages of this invention, both as to its construction and mode of operation will be readily appreciated as the same become better understood by reference to the following detailed description when considered in connection with the accompanying drawings in which like referenced numerals designate like parts throughout the figures.

DESCRIPTION OF THE PREFERRED EMBODIMENT

Figures 1, 2, 3:
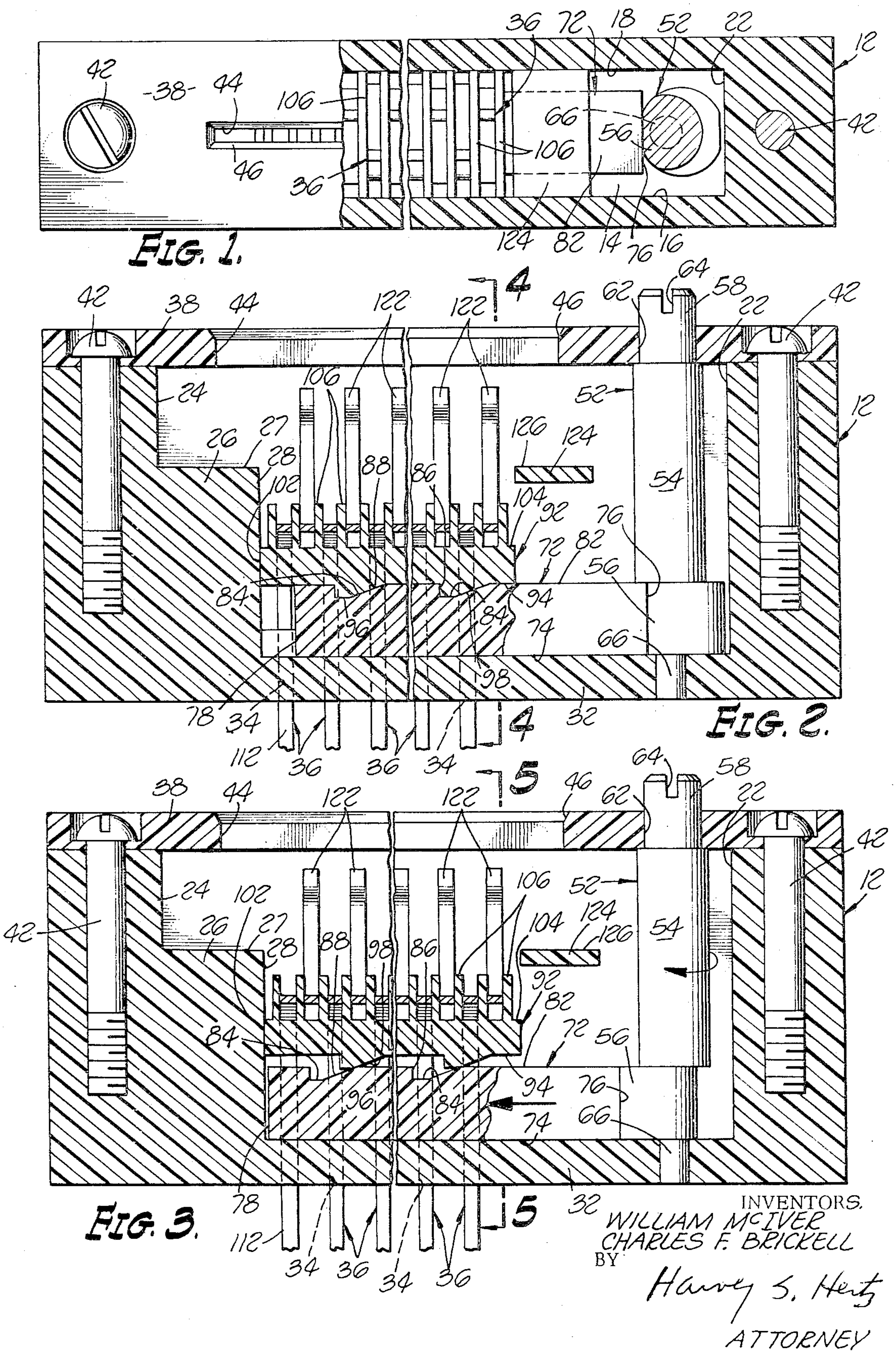
FIG. 1 is a top sectional view of the printed circuit board connector when the connector is in a receiving position.
FIG. 2 is a front sectional view of the printed circuit board connector of FIG. 1.
FIG. 3 is a front sectional view of the printed circuit board connector with the connector moved to a position to make a contact with the printed circuit board pads.

Referring now to the drawings, there is shown a preferred embodiment of the printed circuit board connector in accordance with the invention. The printed circuit board connector comprises an elongated housing 12 having a generally rectangular shaped opening 14 along the top portion thereof. The opening 14 is defined by a pair of side walls 16, 18 and a pair of end walls 22, 24. Extending from the lower half of the end wall 24 is a shoulder portion 26 of the housing having a top surface 27 and a vertical facing edge 28. The bottom of the housing is formed of an integral bottom member 32 having apertures 34 through which the connector contacts 36 pass. The top of the housing 12 is covered with a rectangular plate 38, whose dimensions are generally equal to that of the housing 12 and is secured to the housing by means of bolts 42 which pass through the top wall 38 and into the body of the housing. Alternatively, the plate 38 could be cemented to the top of the housing. The plate 38 contains a generally rectangular opening 44 having a chamfered top edge 46. The opening 44, together with the chamber 46, provides a guide for insertion of a printed circuit board.

Actuaton means for moving the connector contact 36 into contact with corresponding printed circuit board pads on the inserted printed circuit board is formed by a cam actuator 52. The cam actuator 52 is formed of a rotatable shaft 54 which is connected between the top wall 38 of the housing and a bearing surface 56. The bearing surface is positioned between the bottom 32 of the housing and the bottom of the shaft 54. Rotation of the shaft 54 and the bearing surface 56 is accomplished by means of an actuating member 58, which is connected to the shaft 54 and protrudes through an opening 62 in the top wall 38 of the housing. The actuating member may contain a slot 64 for insertion of a driving means, such as a screwdriver, for rotating the device. The bottom of the bearing surface 56 is connected to a lower shaft member 66 which is secured within the bottom wall 32 of the housing.

A dielectric slidable plate member 72, whose height is approximately the same as that of the bearing member 56, contains a bottom wall 74 which is slidable in relation to the bottom portion 32 of the housing, and a first end wall 76 which abuts the bearing surface 56. The other end wall 78 of the housing is spaced from the shoulder 28 of the housing. The top wall of the member 72 contains a plurality of slotted portions 84. Each of the slotted portions contain a vertical shoulder 86 which connects the top surface 82 of the member 72 to one side of the slotted portion 84 and the other side of the slotted portion 84 is connected by means of a ramp portion 88 to the top surface 82 of the member 72.

Figure 4:
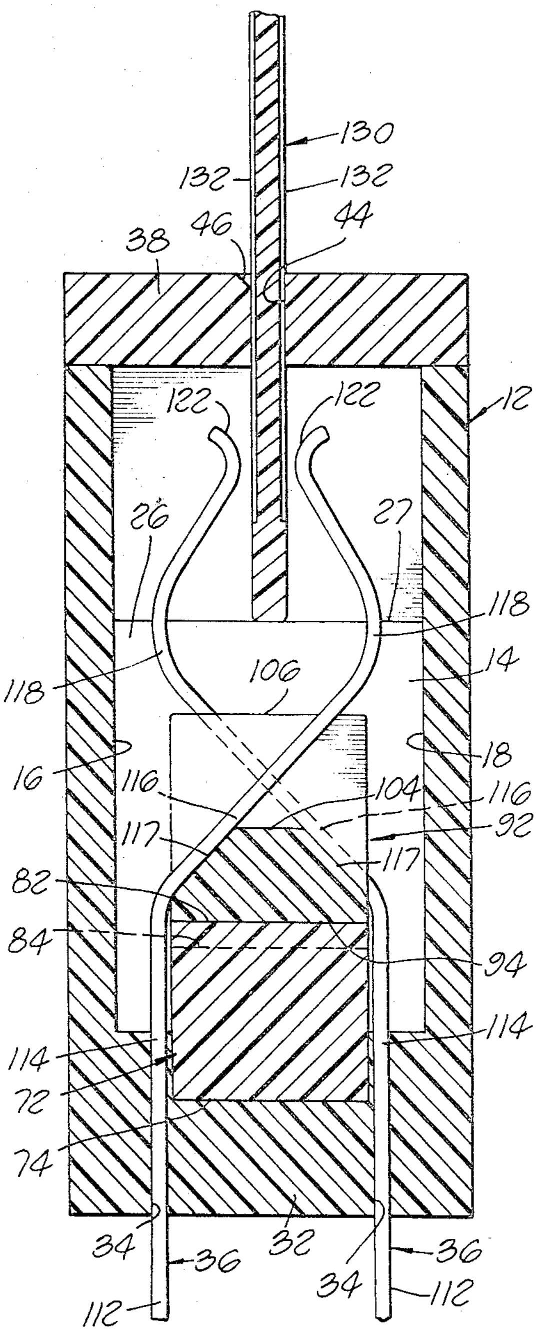
FIG. 4 is a view taken along the line 4—4 of FIG. 2.
Figure 5:
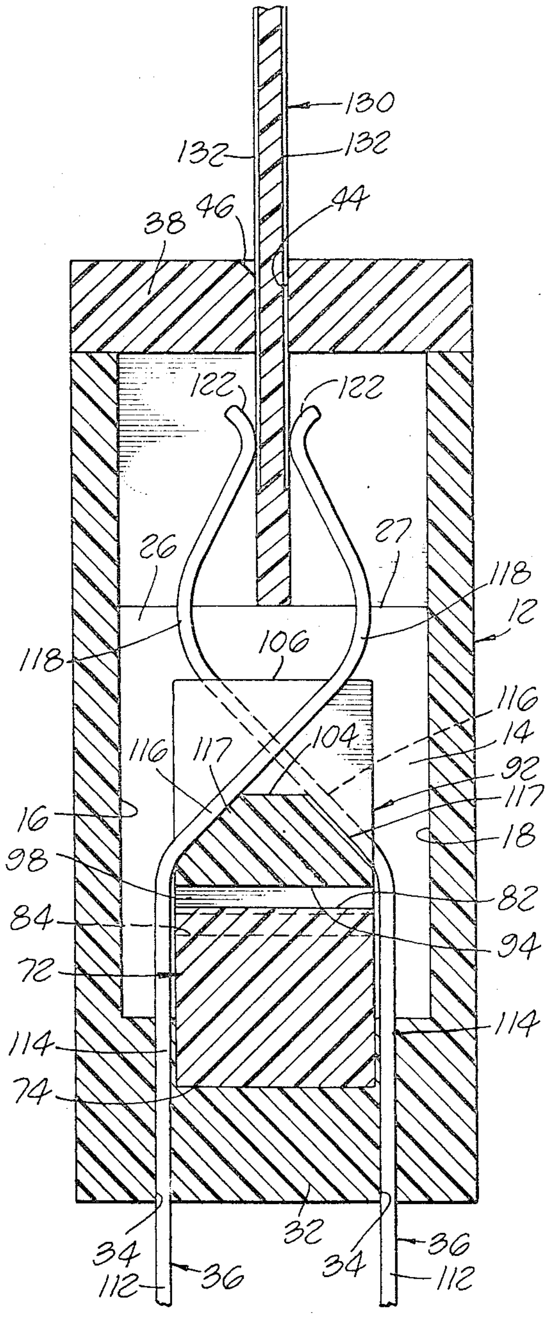
FIG. 5 is a sectional view of the printed circuit board connector taken along the line 5—5 of FIG. 3.

A vertical actuating member 92, which is generally truncated, as viewed in FIGS. 4 and 5, contains a bottom surface 94 which abuts the top surface 82 of the member 72. The bottom surface 94 contains downwardly extending sections 96 and ramp sections 98 which abut the slotted portion 84 and ramp portion 88 to form a generally unitary structure therebetween when the cam member 52 is in the position shown in FIG. 2. One end 102 of the vertical actuating member 92 abuts the shoulder 28 of the housing. The top surface 104 of the member 92 contains integral therewith, a plurality of upwardly extending guide members 106 for positioning the connector contacts 36.

Referring now to FIGS. 4 and 5, the connector contacts 36 are formed of a terminating portion 112 which extends through the bottom wall 32 of the housing. The terminating portion is coaxial with a mounting portion 114 which is secured within the slots 34 of the bottom wall of the housing. Each of the contacts 36 then extend upwardly through the bottom wall 32 and curve inwardly to form an actuating portion 116 which rests on the sloping side walls 117 of the actuating member 92. The connectors 36 then extend in a direction parallel to the sloping side walls of member 92 and past the plane where a printed circuit board is normally rested in the housing. The contacts 36 then reverse direction again at a curved portion 118 and terminates at its contact surface 122 in a sloped surface portion. A member 124 is mounted in a horizontal plane and is secured to the side walls 16, 18. The top surface 126 of member 124 is parallel with the top surface 27. The two surfaces 27 and 126 provide a stop for a printed circuit board inserted in the opening 44.

With the foregoing in mind, a printed circuit board 130 having contact pads 132 is inserted in the connector through the opening 44 a sufficient amount until it reaches the top surfaces 27 and 126. Then the cam 52 is rotated from the position depicted in FIGS. 2 and 4, until it is in the position as depicted in FIGS. 3 and 5. Rotation of the shaft 54 causes the bearing surface 56 to move member 72 to the left in FIG. 2, until it reaches a position as shown in FIG. 3. The movement of the shaft to the left causes the member 92, which is slidably movable, to move along its ramp portion 98 with respect to the ramp portion 88 of the member 72, thus, causing the member 92 to move vertically upward. Upward vertical movement of the member 92 causes the contacts 36 to spread outwardly in the vicinity of the portion 116 thereof, as shown in FIG. 5, thus causing the contact surface 122 to come into contact with the contact pads 132 of the printed circuit board 130. Thus, as can readily be seen, the reaction to the actuating force on the contacts is in the base of the conncetor. Further, rotation of the cam back to its original position causes the member 92 to force the member 72 back to its original position, and simultaneously allows the contacts 36 to return to their original position, thus allowing the printed circuit board to be easily removed. Further, it should be noted that upon contact of the contact surface 122 to the connector pads 132, some degree of desirable wiping action occurs.

Should it be desired to provide a more positive return for the member 72, a spring could be mounted between the surface 28 and 78. Alternatively, the bearing surface

56 could be mounted wholly within the member 72 and upon rotation of the cam actuator to the position of FIG. 2, the member 72 is positively returned to its original position.

What is claimed is:

1. A printed circuit board comprising an elongated housing member arrangement about a longitudinal axis having an apertured top wall, a bottom wall and side walls,

- a slidable plate member mounted in said housing, movable in a direction parallel to the longitudinal axis of said housing.
- an actuating member adjacent said plate member and movable by said plate member in a direction perpendicular to said longitudinal axis and toward said apertured top wall,
- at least one electrical contact having a portion thereof abutting said actuating member, said contact being movable from a first predetermined position to a second predetermined position, and,
- means for moving said slidable plate member parallel to said longitudinal axis, movement of said slidable plate member causing said actuating member to move perpendicular thereto and causing said electrical contact to move from said first predetermined position to said second predetermined position.

2. A printed circuit board connector in accordance with claim 1 wherein said actuating member contains a plurality of upwardly extending guide members for positioning said connector contact.

3. A printed circuit board connector in accordance with claim 1 wherein said connector contains a plurality of contacts, and wherein said actuating member is generally truncated in shape, said abutting portion of each of said contacts resting on the sloping side walls of the truncated member, and wherein movement of said slidable plate member causes said contact abutting portion to move outwardly simultaneously causing the contacting portion of said contact to move inwardly.

4. A printed circuit board connector in accordance with claim 1, wherein said slidable plate member contains a slotted surface portion, said actuating member having a continuous surface normally juxtaposed with said actuating member slotted portion.

5. A printed circuit board connector in accordance with claim 4 wherein said slidable plate member contains a plurality of slotted portions, movement of said slidable plate member causing said normally juxtaposed surfaces to be separated.

References Cited

UNITED STATES PATENTS 3,475,717 10/1969 Lane ............ 339—75MP

OTHER REFERENCES

IBM Technical Disclosure Bulletin, vol. 10, No. 11, p. 1695, April 1968, Schmieg et al.

MARVIN A. CHAMPION, Primary Examiner

J. H. McGLYNN, Assistant Examiner

U.S. Cl. X.R.

339—176